United States Patent
Lee et al.

(10) Patent No.: US 8,553,479 B2
(45) Date of Patent: Oct. 8, 2013

(54) SEMICONDUCTOR MEMORY DEVICE

(75) Inventors: Dong-Geun Lee, Gyeonggi-do (KR); Chang-Ho Do, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 104 days.

(21) Appl. No.: 13/198,306

(22) Filed: Aug. 4, 2011

(65) Prior Publication Data

US 2012/0195142 A1 Aug. 2, 2012

(30) Foreign Application Priority Data

Jan. 28, 2011 (KR) .................. 10-2011-0008936

(51) Int. Cl.
 *G11C 7/00* (2006.01)
(52) U.S. Cl.
 USPC ....................................... 365/194; 365/230.06
(58) Field of Classification Search
 USPC ............................................. 365/194, 230.06
 See application file for complete search history.

(56) References Cited

U.S. PATENT DOCUMENTS

2009/0316513 A1* 12/2009 Na ........................... 365/230.06
2011/0103136 A1* 5/2011 Akiyama et al. ............... 365/149

FOREIGN PATENT DOCUMENTS

| KR | 100640651 | 11/2006 |
|---|---|---|
| KR | 100940827 | 2/2010 |
| KR | 1020100076762 | 7/2010 |
| KR | 1020100106147 | 10/2010 |

OTHER PUBLICATIONS

Office Action issued by the Korean Intellectual Property Office on Jun. 28, 2012.
Notice of Allowance issued by the Korean Intellectual Property Office on Dec. 27, 2012.

* cited by examiner

*Primary Examiner* — Michael Tran
(74) *Attorney, Agent, or Firm* — IP & T Group LLP

(57) ABSTRACT

A semiconductor memory device includes a main word line signal generator configured to generate a main word line signal having a first swing width, a sub-word line signal generator configured to generate a first sub-word line signal and a second sub-word line signal having a second swing width and a third swing width, respectively, a first sub-word line driver configured to drive a corresponding sub-word line with the first sub-word line signal or a negative word line voltage in response to the main word line signal, and a second sub-word line driver configured to drive the corresponding sub-word line with the negative word line voltage in response to the second sub-word line signal.

20 Claims, 6 Drawing Sheets

SEMICONDUCTOR MEMORY DEVICE

CROSS-REFERENCE TO RELATED APPLICATIONS

The present application claims priority of Korean Patent Application No. 10-2011-0008936, filed on Jan. 28, 2011, which is incorporated herein by reference in its entirety.

BACKGROUND

1. Field of the Invention

Exemplary embodiments of the present invention relate to a semiconductor device design, and more particularly, to a semiconductor memory device which drives negative word lines.

2. Description of the Related Art

A negative word line driving method is a method performed by a word line driving circuit that drives word lines by applying a high voltage VPP to a word line to enable the word line and applying a voltage VBBW lower than a ground voltage VSS to the word line to disable the word line. In general, the ground voltage VSS is applied to a word line to disable the word line, but according to the negative word line driving method, a voltage VBBW lower than a ground voltage VSS is applied to the word line to disable the word line.

When the negative word line driving method is used, refresh characteristics and other AC parameters may be improved. In particular, since the voltage VBBW, used as a voltage level for disabling the word line, is lower than the ground voltage VSS, the data retention time of a cell is extended so as to reduce the use of a refresh cycle.

Also, when a voltage VCC, lower than the high voltage VPP, is used to enable a word line, write recovery time TWR may be improved. For these reasons, the negative word line driving method is adopted.

FIG. 1 is a block view illustrating a known semiconductor memory device adopting a negative word line driving scheme.

Referring to FIG. 1, the known semiconductor memory device includes a block selection address generation unit 10, a row decoder control unit 20, a sub-word line selection unit 30, a main word line selection unit 40, and a sub-word line driving unit 50.

To briefly have a look at the operation of the known semiconductor memory device, the block selection address generation unit 10 generates a block selection address BAX having block information in response to an active signal. The main word line selection unit 40 selects and drives a corresponding main word line MWLB (the "B" indicates that an inverted signal is transferred through the main word line) from among a plurality of main word lines (not shown) based on a portion (e.g., BAX<3:8> of the block selection address BAX. Meanwhile, the sub-word line selection unit 30 generates an output FXB for selecting a sub-word line SWL based on another portion (e.g., BAX<0:2> of the block selection address BAX. Further, the sub-word line driving unit 50 selects and drives a sub-word line SWL from among a plurality of sub-word lines (not shown) corresponding to the main word line MWLB selected by the main word line selection unit 40 based on the output FX of the sub-word line selection unit 30.

The row decoder control unit 20 generates a word line pre-charge signal WLOFF for disabling a word line. The sub-word line selection unit 30 and the main word line selection unit 40 are controlled based on the word line pre-charge signal WLOFF. Accordingly, while word lines are enabled based on the block selection address BAX, they are disabled based on the word line pre-charge signal WLOFF.

The arrows directed toward the constituent units 20 to 50 in FIG. 1 signify that the negative word line driving method is used. In other words, in each of the constituent units 20 to 50 a voltage VBBW lower than a ground voltage VSS is used as a power source for supplying a logic low level. In short, when a word line is disabled, the voltage VBBW, which is lower than the ground voltage VSS, is applied to the word line.

FIG. 2 is a circuit diagram illustrating the known semiconductor memory device adopting the negative word line driving scheme of FIG. 1 in more detail.

Referring to FIG. 2, among the constituent elements of the known semiconductor memory device adopting the negative word line driving scheme, the main word line selection unit 40 includes a main word line decoder 42 and a main word line signal generator 44. The main word line decoder 42 selects a corresponding main word line MWL among a plurality of main word lines (not shown) by decoding a portion (e.g., BAX<3:8>) of the block selection address BAX. The main word line signal generator 44 generates a main word line signal OP_MWLB to select between an active driving and a pre-charge driving of the main word line MWLB in response to an output signal DBC_MWL of the main word line decoder 42.

Also, the sub-word line selection unit 30 includes a sub-word line decoder 32 and a sub-word line signal generator 34. The sub-word line decoder 32 selects a corresponding sub-word line SWL among a plurality of sub-word lines (not shown) by decoding a portion (e.g., BAX<0:2>) of the block selection address BAX. The sub-word line signal generator 34 generates a sub-word line signal FX, which is used to drive the selected sub-word line, in response to an output signal DEC_SWL of the sub-word line decoder 32.

The sub-word line driving unit 50 includes a first sub-word line driver 52 and a second sub-word line driver 54. The first sub-word line driver 52 drives the corresponding sub-word line SWL with a voltage based upon the sub-word line signal FX or a negative word line voltage VBBW in response to the main word line signal OP_MWLB. The second sub-word line driver 54 drives the corresponding sub-word line SWL with the negative word line voltage VBBW in response to a sub-word line bar signal FXB.

Referring to FIG. 2, the pre-charge operation of the known semiconductor memory device adopting the negative word line driving scheme is described hereafter.

First, before the pre-charge operation is performed, the semiconductor memory device may be in the state of an active operation, and therefore, the voltage level on both the main word line MWLB and the sub-word line SWL may be at a logic high level equal to the high voltage VPP.

When the pre-charge operation is performed on the semiconductor in the activation state, a main word line decoding signal DEC_MWL generated in the main word line decoder 42 and a sub-word line decoding signal DEC_SWL generated in the sub-word line decoder 32 transition to a logic low level equal to the negative word line voltage VBBW. Accordingly, the main word line signal OP_MWLB and the sub-word line bar signal FXB transition to a logic high level equal to the high voltage VPP, and a sub-word line driving selection signal FX transitions to a logic low level equal to the ground voltage VSS. As a result, the main word line MWLB selected by the main word line decoder 42 is driven with the high voltage VPP, and the sub-word line SWL selected by the sub-word line decoder 32 is driven with the negative word line voltage VBBW.

However, there are several concerns regarding the pre-charge operation of the known semiconductor memory device adopting the negative word line driving scheme.

First, in order to change the sub-word line SWL from the active state to the pre-charge state, the sub-word line SWL is disconnected from the high voltage VPP end and directly connected to a negative word line voltage VBBW end. Therefore, noise may be temporarily applied to the negative word line voltage VBBW end causing the level of the negative word line voltage VBBW to increase for a predetermined time. When this phenomenon occurs, off-leakage current is generated in many cell transistors which sustain a voltage level by receiving the negative word line voltage VBBW. Thus, the voltage level may not be sustained for a sufficient time.

Second, the sub-word line bar signal FXB swings between the high voltage VPP and the negative word line voltage VBBW and the negative word line voltage VBBW and the high voltage VPP have a great voltage difference. Moreover, the negative word line voltage VBBW and the high voltage VPP, having this great voltage difference, are applied to the source and drain ends of an NMOS transistor EN5 in a sub-hole region at a moment when the sub-word line SWL is pre-charged and driven. For this reason, the NMOS transistor EN5 of a sub-hole region is deteriorated, and thus, the size of current leaking from the high voltage VPP end toward the negative word line voltage VBBW end is increased. As a result, stand-by current of the semiconductor memory device may be increased.

Third, since a pre-charge operation is performed when the a logic high level voltage equal to the high voltage VPP is applied to a gate end of the NMOS transistor EN5 of the sub-hole region, much current flows through the NMOS transistor EN5 temporarily, causing a short phenomenon between a bit line contact of a gate end and a bit line contact of a source end in the NMOS transistor EN5. Therefore, the semiconductor memory device may fail.

SUMMARY

Exemplary embodiments of the present invention are directed to a semiconductor memory device which may minimize the leakage current and/or improve the operational stability by using a circuit that performs a pre-charge driving operation of sub-word lines through systematic timing control.

In accordance with an exemplary embodiment of the present invention, a semiconductor memory device includes a main word line signal generator configured to generate a main word line signal having a first swing width, a sub-word line signal generator configured to generate a first sub-word line signal and a second sub-word line signal having a second swing width and a third swing width, respectively, a first sub-word line driver configured to drive a corresponding sub-word line with the first sub-word line signal or a negative word line voltage in response to the main word line signal, and a second sub-word line driver configured to drive the corresponding sub-word line with the negative word line voltage in response to the second sub-word line signal.

In accordance with another exemplary embodiment of the present invention, a semiconductor memory device includes a system having a semiconductor memory device, the system including a block selection address generation unit configured to generate an address, a sub-word line selection unit configured to generate a first sub-word line signal and a second sub-word line signal having different swing widths, a main word line selection unit configured to generate a main word line signal, and a sub-word line driving unit configured to drive a selected sub-word line.

DETAILED DESCRIPTION

Figure 1:
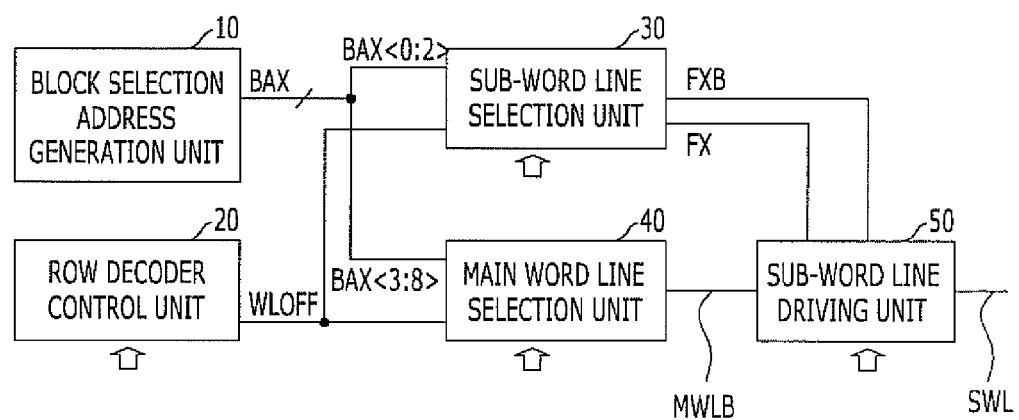
FIG. 1 is a block view illustrating a known semiconductor memory device adopting a negative word line driving scheme.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3A:
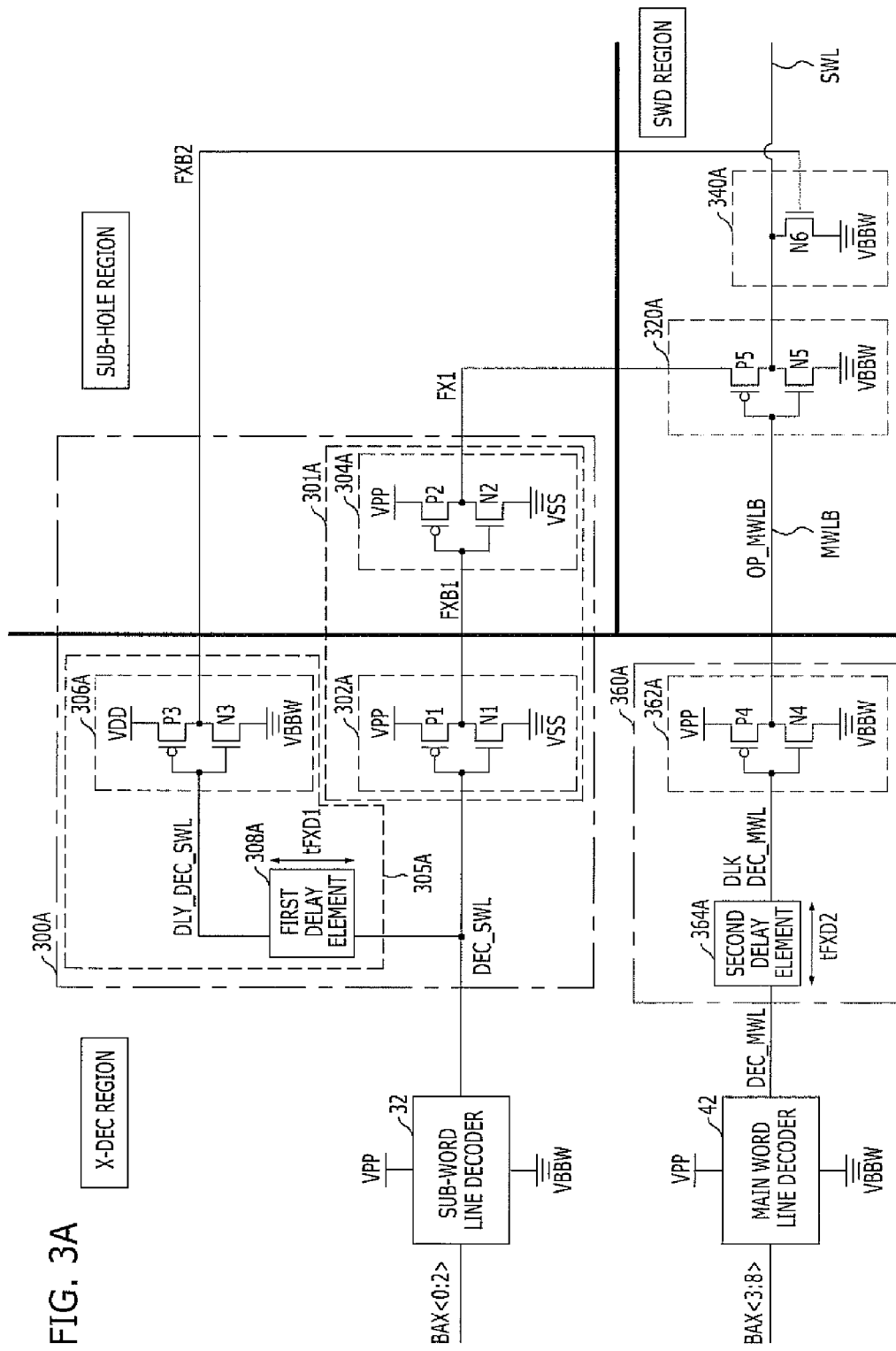
FIGS. 3A and 3B are circuit diagrams illustrating semiconductor memory devices adopting a negative word line driving scheme in accordance with exemplary embodiments of the present invention.
Figure 3B:
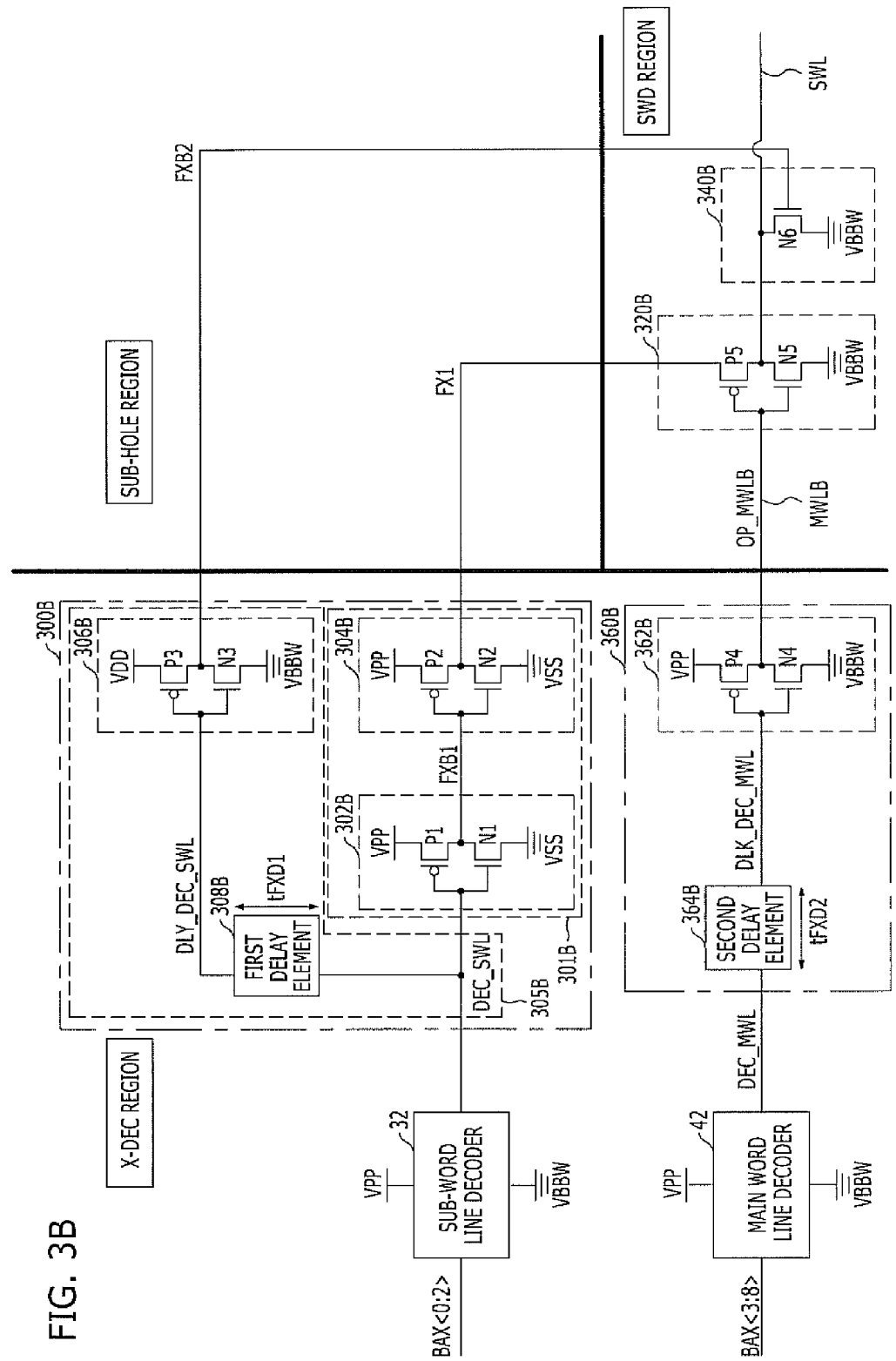

FIGS. 3A and 3B are circuit diagrams illustrating semiconductor memory devices adopting a negative word line driving scheme in accordance with exemplary embodiments of the present invention.

Referring to FIG. 3A, the semiconductor memory device adopting a negative word line driving scheme in accordance with an exemplary embodiment of the present invention includes: a main word line signal generator 360A, a sub-word line signal generator 300A, a first sub-word line driver 320A, and a second sub-word line driver 340A. The main word line signal generator 360A generates a main word line signal OP_MWLB having a first swing width between a high voltage VPP and a negative word line voltage VBBW. The sub-word line signal generator 300A generates a first sub-word line signal FX1 having a second swing width between the high voltage VPP and a ground voltage VSS and a second sub-word line signal FXB2 having a third swing width between a power source voltage VDD and the negative word line voltage VBBW. Herein, the high voltage VPP is greater than the power source voltage VDD, which is greater than the ground voltage VSS, which is greater than the negative word line voltage VBBW (i.e., VPP>VDD>VSS>VBBW). The first sub-word line driver 320A drives a corresponding sub-word line SWL with the voltage of the first sub-word line signal FX1 or the negative word line voltage VBBW in response to the main word line signal OP_MWLB. The second sub-word line driver 340A drives the corresponding sub-word line SWL with the negative word line voltage VBBW in response to the second sub-word line signal FXB2. Also, the semiconductor memory device adopting a negative word line driving scheme in accordance with the exemplary embodiment of FIG. 3A further includes: a main word line decoder 42 and a sub-word line decoder 32, The main word line decoder 42 selects a corresponding main word line MWL among a plurality of main word lines (not shown) by decoding a portion (e.g., BAX<a+1:N>, where "a" is any integer between 0 and N and where "N" is any positive integer) of the block selection address BAX. That is, the main word line decoder 42 generates a main word line decoding signal DEC_MWL on a main word line MWL selected according to a portion (e.g., BAX<a+1:N>) of the block selection address BAX. Meanwhile, the sub-word line decoder 32 selects a corresponding sub-word line SWL among a plurality of sub-word lines (not shown) by decoding another portion (e.g., BAX<0:a>) of the block selection address BAX. That is, the sub-word line decoder 32 selects the corresponding sub-word line SWL by generating a sub-word line decoding signal DEC_SWL on a particular line according to a portion (e.g., BAX<0:a>) of the block selection address BAX.

Herein, the sub-word line signal generator 300A includes a first sub-word line signal generator 301A, and a second sub-word line signal generator 305A. The first sub-word line signal generator 301A generates a first sub-word line signal FX1 in response to the sub-word line decoding signal DEC_SWL. The second sub-word line signal generator 305A generates a second sub-word line signal FXB2 in response to a sub-word line decoding signal DEC_SWL. The second sub-word line signal generator 305A delays the generation of the second sub-word line signal FXB2 so that it is provided to the sub-word line driving region (SWD region) at a time later than the first sub-word line signal FX1 by a first predetermined time tFXD1.

The first sub-word line signal generator 301A includes a first inversion driving element 302A for inversion-driving the sub-word line decoding signal DEC_SWL and outputting the resultant signal as a first sub-word line bar signal FXB1. The first sub-word line signal generator 301A also includes a second inversion driving element 304A for inversion-driving the first sub-word line bar signal FXB1 and outputting the resultant signal as a first sub-word line signal FX1.

As shown in FIG. 3A, the first inversion driving element 302A is disposed in an X-decoder region (X-DEC region) of the semiconductor memory device, and the second inversion driving element 304A is disposed in a sub-hole region, which is close to a corresponding sub-word line driving region (SWD region). In short, since the second inversion driving element 304A, which directly applies a high level voltage VPP or a ground voltage VSS to a corresponding sub-word line SWL, is disposed close to the corresponding sub-word line SWL, the second inversion driving element 304A may operate stably even though the second inversion driving element 304A has a relatively small size.

Figure 3C:
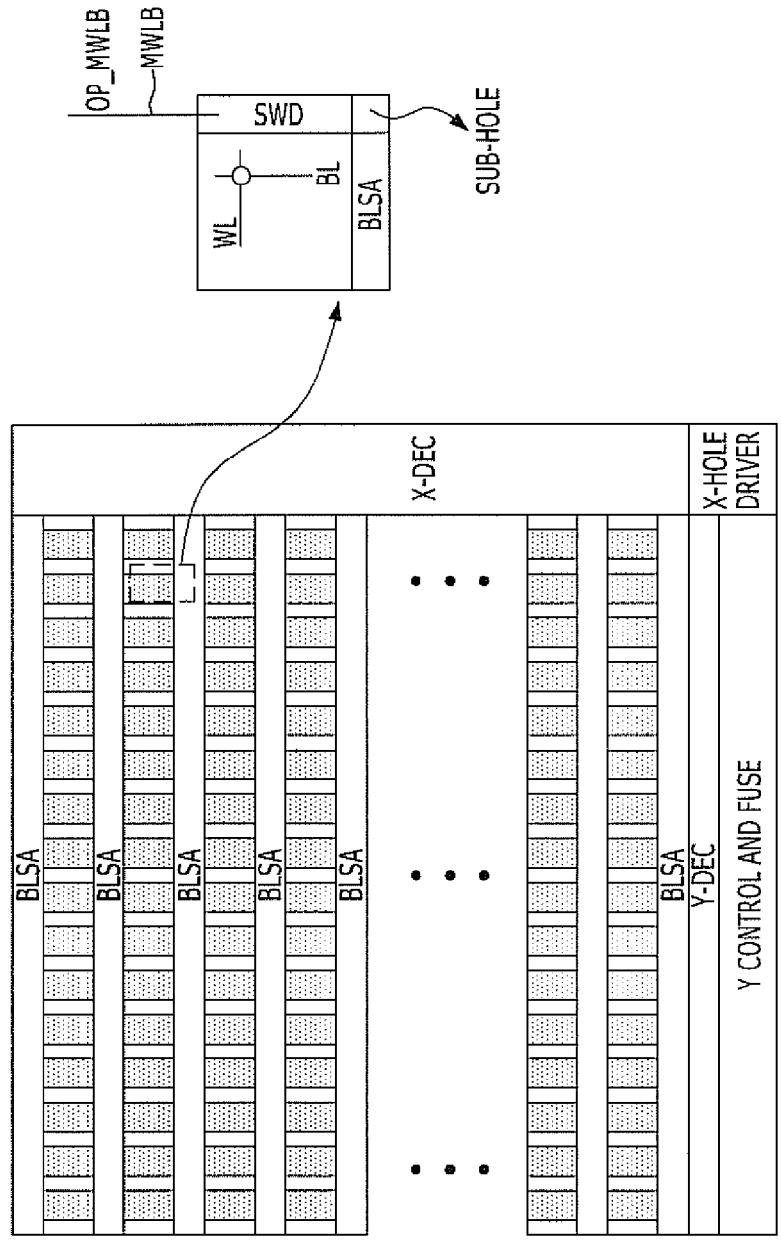
FIG. 3C is a block diagram conceptually illustrating a layout of a semiconductor memory in accordance with exemplary embodiments of the present invention.

FIG. 3C shows the difference in location more clearly. FIG. 3C conceptually illustrates a layout of the semiconductor region. As shown in FIG. 3C, the X-decoder region (X-DEC region), where the first inversion driving element 302A is disposed, belongs to the outermost area of a bank, and therefore, is relatively distant from the memory cells that it helps to select and drive. On the other hand, a sub-hole region, where the second inversion driving element 304A is disposed, is located relatively close to each memory cell in the bank. FIG. 3C shows that the sub-hole region is a region adjacent to the bit line sensing area BLSA and the sub-word line driving region SWD, which are located adjacent to a corresponding memory cell. Accordingly, a plurality of sub-hole regions, sub-word line driving regions SWD, and bit line sensing areas BLSA may be located throughout a bank, while the X-decoder region (X-DEC Region) is located on the outer region of the bank. Further, the X-decoder region (X-DEC Region) is connected to the memory cells via one or more main word lines that are coupled to circuitry in corresponding sub-word line driving regions SWD.

Returning to FIG. 3A, the first inversion driving element 302A includes a first pull-up driver P1 and a first pull-down driver N1. The first pull-up driver P1 may be a PMOS transistor, and is coupled between a high voltage VPP end and an output node for outputting the first sub-word line bar signal FXB1. The first pull-up driver P1 pull-up drives the first sub-word line bar signal FXB1 in response to the sub-word line decoding signal DEC_SWL. Meanwhile, the first pull-down driver N1 may be an NMOS transistor, and is coupled between the output node for outputting the first sub-word line bar signal FXB1 and a negative word line voltage VBBW end. The first pull-down driver N1 pull-down drives the first sub-word line bar signal FXB1 in response to the sub-word line decoding signal DEC_SWL.

Similarly, the second inversion driving element 304A includes a second pull-up driver P2 and a second pull-down driver N2. The second pull-up driver P2 may be a PMOS transistor, and is coupled between the high voltage VPP end and an output node for outputting a first sub-word line signal FX1. The second pull-up driver P2 pull-up drives the first sub-word line signal FX1 in response to the first sub-word line bar signal FXB1. The second pull-down driver N2 may be an NMOS transistor, and is coupled between the output node for outputting the first sub-word line signal FX1 and a ground voltage VSS end. The second pull-down driver N2 pull-down drives the first sub-word line signal FX1 in response to the first sub-word line bar signal FXB1.

The second sub-word line signal generator 305 includes a first delay element 308A and a third inversion driving element 306A. The first delay element 308A delays a sub-word line decoding signal DEC_SWL by a first predetermined time tFXD1. The third inversion driving element 306A inverts and drives an output signal DLY_DEC_SWL of the first delay element 308A. The resultant signal output from the third inversion driving element 306A is referred to as a second sub-word line signal FXB2.

In more detail, the third inversion driving element 306A includes a third pull-up driver P3 and a third pull-down driver N3. The third pull-up driver P3 may be a PMOS transistor, and is coupled between a power source voltage VDD end and an output node for outputting the second sub-word line signal FXB2. The third pull-up driver P3 pull-up drives the second sub-word line signal FXB2 in response to the output signal DLY_DEC_SWL of the first delay element 308A. Meanwhile, the third pull-down driver N3 may be an NMOS transistor, and is coupled between the output node for outputting the second sub-word line signal FXB2 and the negative word line voltage VBBW end. The third pull-down driver N3 pull-down drives the second sub-word line signal FXB2 in response to the output signal DLY_DEC_SWL of the first delay element 308A.

The main word line signal generator 360A includes a second delay element 364A and a fourth inversion driving element 362A. The second delay element 364A delays a main word line decoding signal DEC_MWL by a second predetermined time tFXD2, which may be equal to the delay of the first delay element 308A. The fourth inversion driving element 362A inverts and drives an output signal DLY_DEC_MWL of the second delay element 364A. The resultant signal output from the fourth inversion driving element 362A is referred to as a main word line signal OP_MWLB.

In more detail, the fourth inversion driving element 362A includes a fourth pull-up driver P4 and a fourth pull-down driver N4.

The fourth pull-up driver P4 may be a PMOS transistor, and is coupled between the high voltage VPP end and an output node for outputting the main word line signal OP_MWLB onto the main word line MWLB. The fourth pull-up driver P4 pull-up drives the main word line signal OP_MWLB in response to the output signal DLY_DEC_MWL of the second delay element 364A. The fourth pull-down driver N4 may be an NMOS transistor, and is coupled between the output node for outputting the main word line signal OP_MWLB and the negative word line voltage VBBW end. The fourth pull-down driver N4 pull-down drives the main word line signal OP_MWLB in response to the output signal DLY_DEC_MWL of the second delay element 364A.

The first sub-word line driver 320A includes a fifth pull-up driver P5 and a fifth pull-down driver N5. The fifth pull-up driver P5 may be a PMOS transistor, and is coupled between an output node for outputting a first sub-word line signal FX1 and a corresponding sub-word line SWL. The fifth pull-up driver P5 pull-up drives the sub-word line SWL in response to the main word line signal OP_MWLB. Meanwhile, the fifth pull-down driver N5 may be an NMOS transistor, and is coupled between the sub-word line SWL and the negative word line voltage VBBW end. The fifth pull-down driver N5 pull-down drives the sub-word line SWL in response to the main word line signal OP_MWLB.

The second sub-word line driver 340A includes a sixth pull-down driver N6 which is coupled between the sub-word line SWL end and the negative word line voltage VBBW end. As shown in FIG. 3A, the sixth pull-down driver N6 may be an NMOS transistor. Further, the pull-down driver N6 pull-down drives the sub-word line SWL in response to the second sub-word line signal FXB2.

FIG. 3B shows the structure of another exemplary embodiment of the semiconductor memory device adopting a negative word line driving scheme in accordance with the present invention. By comparing FIGS. 3A and 3B, it can be seen that the structure of FIG. 3B is similar to the structure of FIG. 3A, except for one main difference.

In other words, the semiconductor memory device adopting a negative word line driving scheme in FIG. 3B includes a main word line signal generator 360B, a sub-word line signal generator 300B, a first sub-word line driver 320B, a second sub-word line driver 340B, a main word line decoder 42, and a sub-word line decoder 32. However, in FIG. 3B, a first inversion driving element 302B and a second inversion driving element 304B are both disposed in an X-decoder region (X-DEC Region), which is different from the structure of the semiconductor memory device shown in FIG. 3A.

To be more specific, in the structure of the semiconductor memory device shown in FIG. 3A, the first inversion driving element 302A is disposed in the X-decoder region (X-DEC Region) and the second inversion driving element 304A is disposed in the sub-hole region, which is closer to the corresponding memory cell than the X-decoder region. However, in the structure of the semiconductor memory device shown in FIG. 3B, the first inversion driving element 302B and the second inversion driving element 304B are both disposed in the X-decoder region (X-DEC Region). As a result of placing the second inversion driving element 304B in the sub-hole region between adjacent memory cells of the bank, the area of the X-decoder in FIG. 3A may be reduced in comparison to that of the X-decoder in FIG. 3B. Also, by placing the second inversion driving element 304B in the sub-hole region, the line carrying the first sub-word line signal FX1 may be shortened.

As illustrated in FIG. 3C, each memory cell has a corresponding sub-hole region, which refers to a space between the memory cells or the remaining space immediately adjacent to a memory cell. The absolute area of the sub-hole region may be small and since it exists right next to the region where the cells are gathered densely, the operation of a circuit that belongs to the sub-hole region is highly likely to affect the input/output operation to/from a plurality of cells in many direct/indirect ways. Therefore, for stable operation of the semiconductor memory device, it may be advantageous to minimize the amount of circuitry existing in the sub-hole region.

On the other hand, the X-decoder region (X-DEC Region) belongs to the outermost area of a bank as illustrated in FIG. 3C. That is, the X-decoder region (X-DEC Region) is laid on an area somewhat distant from the region where the cells are gathered densely. Moreover, the absolute area of the X-decoder region (X-DEC Region) may be relatively great. Therefore, as shown in FIG. 3B, although the second inversion driving element 304B is added to the X-decoder region (X-DEC Region), it may not adversely affect the semiconductor memory device.

Also, since the X-decoder region (X-DEC Region) is disposed farther from the region where the cells are gathered densely in comparison to the sub-hole region, which is adjacent to the region where the cells are gathered densely, the size of the second inversion driving element 304B of FIG. 3B may be greater than the size of the second inversion driving element 304A of FIG. 3A in order to secure stability in the negative word line driving operation. This is because the second inversion driving element 304B is a circuit for driving a signal.

Although there is a structural difference in the exemplary embodiments of FIGS. 3A and 3B, their overall operations are similar.

The operation of the semiconductor memory device adopting a negative word line driving scheme in accordance with the exemplary embodiments of the present invention described above is described hereafter.

First, a sub-word line signal generator 300A and 300B generates a first sub-word line signal FX1 whose voltage level swings between a high voltage VPP level and a ground voltage VSS level, and generates a second sub-word line signal FXB2 whose voltage level swings between a power source voltage VDD level and a negative word line voltage VBBW level. Also, a main word line signal generator 360A and 360B generates a main word line signal OP_MWLB whose voltage level swings between the high voltage VPP level and the negative word line voltage VBBW level.

In other words, the first sub-word line signal FX1 generated in the sub-word line signal generator 300A and 300B is driven to the high voltage VPP level in an active operation and is driven to the ground voltage VSS level in the pre-charge operation. Also, the second sub-word line signal FXB2 is driven to the power source voltage VDD level in the active operation and is driven to the negative word line voltage VBBW level in the pre-charge operation. Further, the main word line signal OP_MWLB is driven to the high voltage VPP level in the active operation, and is driven to the negative word line voltage VBBW level in the pre-charge operation.

Furthermore, although the first sub-word line signal FX1 and the second sub-word line signal FXB2 are both generated in response to a sub-word line decoding signal DEC_MWL, the generation of the second sub-word line signal FXB2 occurs after the generation of the first sub-word line signal FX1 by a first predetermined time tFXD1. Also, the main word line decoding signal DEC_MWL is delayed by the second predetermined time tFXD2 before being used to drive the main word line MWLB.

The first predetermined time tFXD1 of the first delay element 308A and 308B for controlling the delay amount between the generation time of the first sub-word line signal FX1 and the generation time of the second sub-word line signal FXB2 may be set by a designer either during the initial fabrication or afterwards. Additionally, the structure of the first delay element 308A and 308B may be any structure in which a signal can be delayed by a desired time. For example, the first delay element 308A and 308B may include an inverter chain (i.e., a series of inverters). Furthermore, it is possible to form the second sub-word line signal generator 305A and 305B by controlling the size of the third pull-up/down drivers P3 and N3 instead of forming the first delay element 308A and 308B.

Although the main word line signal OP_MWLB is generated in response to the main word line decoding signal DEC_MWL, it is desirable to generate the main word line signal OP_MWLB at the same timing as the second sub-word line signal FXB2. Thus, when it is assumed that the main word line decoding signal DEC_MWL and the sub-word line decoding signal DEC_SWL are generated at the same timing, the first predetermined time tFXD1 is equal to the second predetermined time tFXD2.

The second predetermined time FXD2 of the second delay element 364A and 364B for controlling the delay amount of the main word line decoding signal DEC_MWL may be set by a designer either during the initial fabrication or afterwards. Additionally, the structure of the second delay element 364A and 364B may be any structure in which a signal can be delayed by a desired time. For example, the second delay element 364A and 364B may include an inverter chain (i.e., a series of inverters). Also, the second delay element 364A and 364B can have the same structure or a different structure than the first delay element 308A and 308B. Furthermore, it is possible to form the main word line signal generator 360A and 360B by controlling the size of the fourth pull-up/down drivers P4 and N4 instead of forming the second delay element 364A and 364B.

Accordingly, the first predetermined time FXD1 may be the same or different from the second predetermined time FXD2, That is, the first delay element 308A and 308B and the second delay element 364A and 364B may have the same or different delay amounts. However, preferably the delay amounts are such that the second sub-word line signal FXB2 is generated at approximately the same time as the main word line signal OP_MWLB.

Since the first sub-word line signal FX1, the second sub-word line signal FXB2, and the main word line signal OP_MWLB are generated as described above, it is possible to drain the high voltage VPP of a sub-word line SWL to a ground voltage VSS level through the fifth pull-up driver P5 when the semiconductor memory device transitions from an active operation to a pre-charge operation, and then drain the ground voltage VSS of the sub-word line SWL to the negative word line voltage VBBW level through the fifth pull-down driver N5 and the sixth pull-down driver N6.

In other words, in contrast to the known technology in which the sub-word line SWL goes directly from being coupled to the high voltage VPP end to being coupled to the negative word line voltage VBBW end, the sub-word line SWL of the present invention first goes from being coupled to the high voltage VPP end to being coupled with the ground voltage VSS end, before being coupled to the negative word line voltage VBBW end.

Therefore, the momentary noise applied to the negative word line voltage VBBW end may be decreased. Also, it may be possible to prevent the phenomenon known as the shallow effect which is characterized by an increase in the negative word line voltage VBBW level.

The operation of the sixth pull-down driver N6 according to an exemplary embodiment of the present invention is controlled in response to the second sub-word line signal FXB2 which swings between the power source voltage VDD level and the negative word line voltage VBBW level. Therefore, the deterioration, measured in terms of threshold voltage saturation Vtsat, occurring in the sixth pull-down driver N6 may be reduced.

Furthermore, in the semiconductor memory device according to the present invention, a pre-charge operation may be performed when the power source voltage VDD is supplied to the gate end of the sixth pull-down driver N6. Therefore, in comparison to the known technology, the amount of current at the time of entering the pre-charge operation flowing from the sub-word line SWL to the negative word line voltage VBBW end through the sixth pull-down driver N6 is decreased.

Figure 4A:
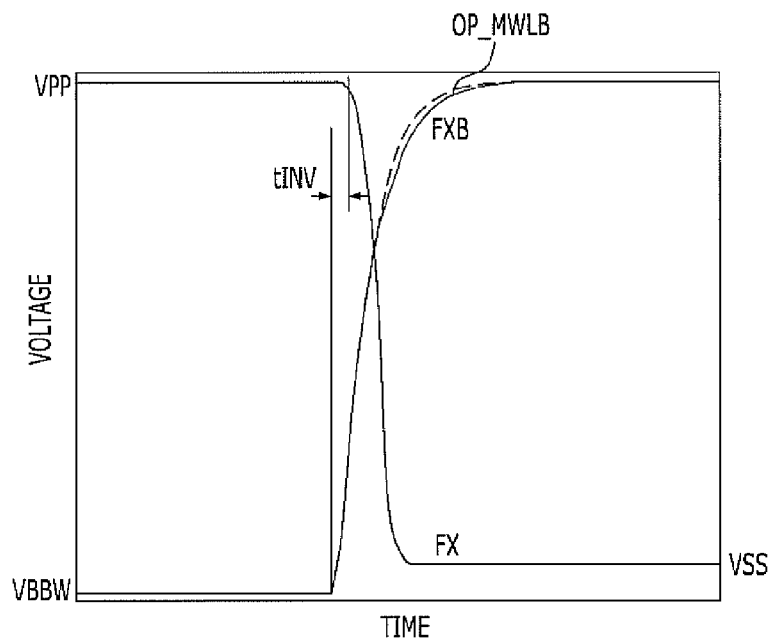
FIGS. 4A and 4B are timing diagrams showing voltage levels during a pre-charge operation for signals of semiconductor memory devices adopting the negative word line driving scheme.
Figure 4B:
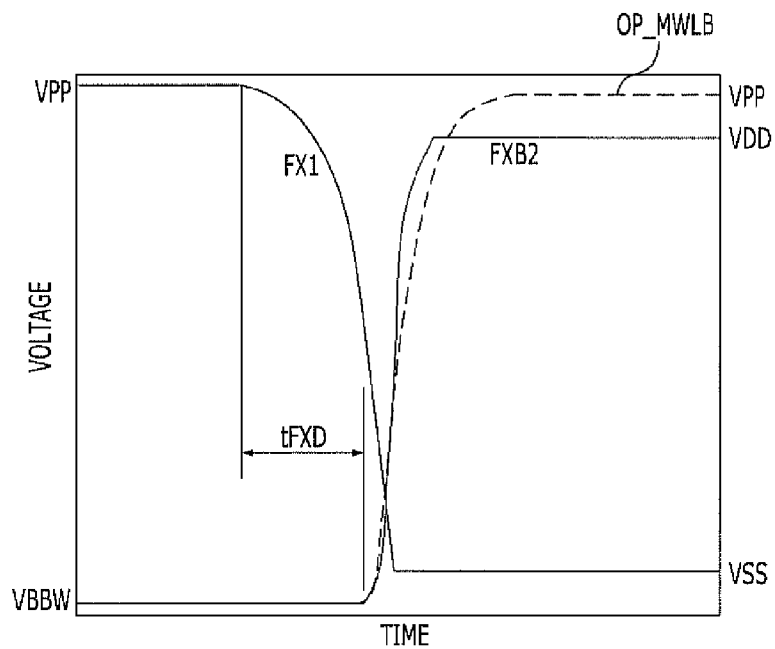

FIGS. 4A and 4B are timing diagrams showing voltage levels during a pre-charge operation for signals of semiconductor memory devices adopting the negative word line driving scheme.

Figure 2:
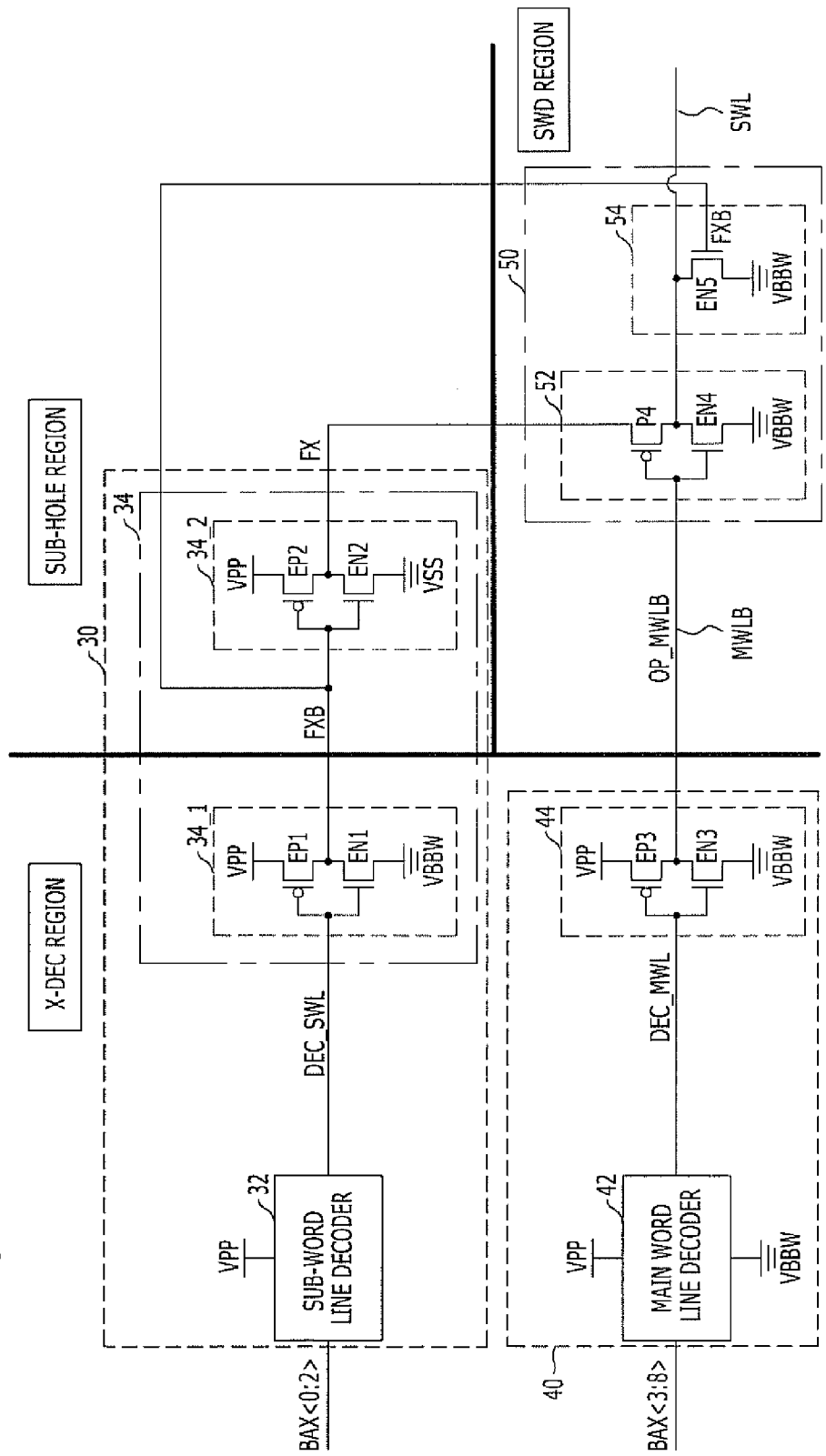
FIG. 2 is a circuit diagram illustrating the known semiconductor memory device adopting the negative word line driving scheme of FIG. 1 in more detail.

FIG. 4A illustrates the pre-charge operation of the known semiconductor memory device adopting a negative word line driving scheme shown in FIG. 2, and FIG. 4B illustrates the pre-charge operation of a semiconductor memory device adopting a negative word line driving scheme in accordance with an exemplary embodiment of the present invention.

First, referring to FIG. 4A, in the pre-charge operation of the known semiconductor memory device adopting a negative word line driving scheme, the voltage levels of the main word line signal OP_MWLB and a sub-word line bar signal FXB are simultaneously increased from the negative word line voltage VBBW level to the high voltage VPP level. Also, the voltage level of a sub-word line signal FX begins to fall from the high voltage VPP level to the ground voltage VSS level at a moment that comes a little after the moment when the voltage of the sub-word line bar signal FXB begins to rise. In FIG. 4A, this difference in time is shown as "tINV."

However, referring to FIG. 4B, in the pre-charge operation of the semiconductor memory device adopting a negative word line driving scheme in accordance with an exemplary embodiment of the present invention, the voltage of the first sub-word line signal FX1 falls from the high voltage VPP level to the ground voltage VSS level. Then, at a moment when a predetermined time tFXD passes from the moment when the voltage level of the first sub-word line signal FX1 begins to fall, the voltage levels of the second sub-word line signal FXB2 and the main word line signal OP_MWLB simultaneously rise from the negative word line voltage VBBW level. Herein, the second sub-word line signal FXB2 rises from the negative word line voltage VBBW level to the power source voltage VDD level, and the main word line signal OP_MWLB rises from the negative word line voltage VBBW level to the high voltage VPP level. Also, in FIG. 4B, the predetermined time tFXD is equal to both the first predetermined time tFXD1 and the second predetermined time tFXD2 of FIGS. 3A and 3B.

Accordingly, the first sub-word line signal FX1, the second sub-word line signal FXB2, and the main word line signal OP_MWLB each have different swing widths.

Further, as shown in FIGS. 4A and 4B, the predetermined time tFXD can be set such that it creates a delay that is greater than the delay represented by tINV.

In accordance with an exemplary embodiment of the present invention, the amount of leakage current occurring in a semiconductor memory device adopting a negative word line driving scheme may be reduced by controlling the pre-charge driving operation of a sub-word line based on a main word line signal OP_MWLB, a first sub-word line signal FX1, and a second sub-word line signal FXB2, which may have different swing widths, and by controlling the timing of signal transitions. Therefore, the operational stability of a semiconductor memory device adopting a negative word line driving scheme in accordance with exemplary embodiments of the present invention may be improved.

While the present invention has been described with respect to the specific embodiments, it will be apparent to those skilled in the art that various changes and modifications may be made without departing from the spirit and scope of the invention as defined in the following claims.

For example, the logic gates and transistors exemplified in the above embodiments may be realized to be different in their position and kind according to the polarity of an input signal.

What is claimed is:

1. A semiconductor memory device, comprising:
    a main word line signal generator configured to generate a main word line signal having a first swing width;
    a sub-word line signal generator configured to generate a first sub-word line signal and a second sub-word line signal having a second swing width and a third swing width, respectively;
    a first sub-word line driver configured to drive a corresponding sub-word line with the first sub-word line signal or a negative word line voltage in response to the main word line signal; and
    a second sub-word line driver configured to drive the corresponding sub-word line with the negative word line voltage in response to the second sub-word line signal,
    wherein the second sub-word line signal is activated later than the first sub-word line signal by a first predetermined time.

2. The semiconductor memory device of claim 1, wherein the sub-word line signal generator comprises:
    a first sub-word line signal generator configured to generate the first sub-word line signal in response to a sub-word line decoding signal; and
    a second sub-word line signal generator configured to generate the second sub-word line signal in response to the sub-word line decoding signal and to delay the output of the second sub-word line signal to a time later than the generation of the first sub-word line signal by the first predetermined time.

3. The semiconductor memory device of claim 2, wherein the main word line signal generator generates the main word line signal in response to a main word line decoding signal and delays the output of the main word line signal to a time later than the generation of the first sub-word line signal by a second predetermined time.

4. The semiconductor memory device of claim 3, wherein the first predetermined time and the second predetermined time are equal.

5. The semiconductor memory device of claim 3, wherein the first sub-word line signal generator comprises:
    a first inversion driving element configured to invert the sub-word line decoding signal and to output a first sub-word line bar signal; and
    a second inversion driving element configured to invert the first sub-word line bar signal and to output the first sub-word line signal.

6. The semiconductor memory device of claim 5, wherein the second sub-word line signal generator comprises:
    a first delay element configured to delay the sub-word line decoding signal by the first predetermined time; and
    a third inversion driving element configured to invert an output signal of the first delay element and to output the second sub-word line signal.

7. The semiconductor memory device of claim 6, wherein the main word line signal generator comprises:
    a second delay element configured to delay the main word line decoding signal by the second predetermined time; and
    a fourth inversion driving element configured to invert an output signal of the second delay element and to output the main word line signal.

8. The semiconductor memory device of claim 7, wherein the first inversion driving element comprises:
    a first pull-up driver which is coupled between a high voltage end and an output node for outputting the first sub-word line bar signal and pull-up drives the output node for outputting the first sub-word line bar signal in response to the sub-word line decoding signal; and
    a first pull-down driver which is coupled between the output node for outputting the first sub-word line bar signal and a ground voltage end and pull-down drives the output node for outputting the first sub-word line bar signal in response to the sub-word line decoding signal.

9. The semiconductor memory device of claim 8, wherein the second inversion driving element comprises:
    a second pull-up driver which is coupled between the high voltage end and an output node for outputting the first sub-word line signal and pull-up drives the output node for outputting the first sub-word line signal in response to the first sub-word line bar signal; and
    a second pull-down driver which is coupled between the output node for outputting the first sub-word line signal and a ground voltage end and pull-down drives the output node for outputting the first sub-word line signal in response to the first sub-word line bar signal.

10. The semiconductor memory device of claim 9, wherein the third inversion driving element comprises:
    a third pull-up driver which is coupled between a power source voltage end and an output node for outputting the second sub-word line signal and pull-up drives the output node for outputting the second sub-word line signal in response to an output signal of the first delay element; and
    a third pull-down driver which is coupled between the output node for outputting the second sub-word line signal and a negative word line voltage end and pull-down drives the output node for outputting the second sub-word line signal in response to an output signal of the first delay element.

11. The semiconductor memory device of claim 10, wherein the fourth inversion driving element comprises:
    a fourth pull-up driver which is coupled between the high voltage end and an output node for outputting the main word line signal and pull-up drives the output node for outputting the main word line signal in response to an output signal of the second delay element; and
    a fourth pull-down driver which is coupled between the output node for outputting the main word line signal and the negative word line voltage end and pull-down drives the output node for outputting the main word line signal in response to the output signal of the second delay element.

12. The semiconductor memory device of claim 11, wherein the first sub-word line driver comprises:
   a fifth pull-up driver which is coupled between an output node for outputting the first sub-word line signal and the sub-word line and pull-up drives the sub-word line in response to the main word line signal; and
   a fifth pull-down driver which is coupled between the sub-word line and the negative word line voltage end and pull-down drives the sub-word line in response to the main word line signal.

13. The semiconductor memory device of claim 12, wherein the second sub-word line driver comprises:
   a sixth pull-down driver which is coupled between the sub-word line and the negative word line voltage end and pull-down drives the sub-word line in response to the second sub-word line signal.

14. The semiconductor memory device of claim 13, wherein the main word line decoding signal and the sub-word line decoding signal are driven with the negative word line voltage level in a pre-charge operation, and driven with the high voltage level in an active operation.

15. The semiconductor memory device of claim 5, wherein the first inversion driving element is disposed in an X-decoder region, and the second inversion driving element is disposed in a sub-hole region.

16. The semiconductor memory device of claim 5, wherein both the first inversion driving element and the second inversion driving element are disposed in an X-decoder region.

17. A system having a semiconductor memory device, the system comprising:
   a block selection address generation unit configured to generate an address;
   a sub-word line selection unit configured to generate a first sub-word line signal and a second sub-word line signal having different swing widths;
   a main word line selection unit configured to generate a main word line signal; and
   a sub-word line driving unit configured to drive a selected sub-word line,
   wherein the second sub-word line signal is activated later than the first sub-word line signal by a first predetermined time.

18. The system of claim 17, wherein the main word line selection unit selects and drives a main word line from among a plurality of main word lines based on a portion of the address, and the sub-word line selection unit generates the first sub-word line signal to select a sub-word line corresponding to the selected main word line based on another portion of the address.

19. The system of claim 18, wherein the sub-word line selection unit comprises:
   a first sub-word line signal generator configured to generate the first sub-word line signal in response to a sub-word line decoding signal; and
   a second sub-word line signal generator configured to generate the second sub-word line signal in response to the sub-word line decoding signal and to delay the output of the second sub-word line signal to a time later than the generation of the first sub-word line signal by the first predetermined time.

20. The system of claim 19, wherein the main word line selection unit generates the main word line signal in response to a main word line decoding signal and delays the output of the main word line signal to a time later than the generation of the first sub-word line signal by a second predetermined time.

* * * * *